United States Patent
Goessel et al.

(10) Patent No.: US 8,060,800 B2
(45) Date of Patent: Nov. 15, 2011

(54) EVALUATION CIRCUIT AND METHOD FOR DETECTING AND/OR LOCATING FAULTY DATA WORDS IN A DATA STREAM $T_n$

(75) Inventors: Michael Goessel, Mahlow (DE);
Andreas Leininger, München (DE);
Heinz Mattes, München (DE);
Sebastian Sattler, München (DE)

(73) Assignee: Infineon Technologies AG, Neubiberg (DE)

( * ) Notice: Subject to any disclaimer, the term of this patent is extended or adjusted under 35 U.S.C. 154(b) by 218 days.

(21) Appl. No.: 10/577,288

(22) PCT Filed: Oct. 22, 2004

(86) PCT No.: PCT/DE2004/002362
§ 371 (c)(1),
(2), (4) Date: Jan. 15, 2007

(87) PCT Pub. No.: WO2005/040839
PCT Pub. Date: May 6, 2005

(65) Prior Publication Data
US 2008/0040638 A1    Feb. 14, 2008

(30) Foreign Application Priority Data
Oct. 24, 2003 (DE) .................. 103 49 933

(51) Int. Cl.
*G01R 31/28* (2006.01)
*G06F 11/00* (2006.01)
(52) U.S. Cl. .................. 714/732; 714/736
(58) Field of Classification Search .......... 714/724, 714/732, 733, 734
See application file for complete search history.

(56) References Cited

U.S. PATENT DOCUMENTS

| | | | | |
|---|---|---|---|---|
| 5,224,107 A | * | 6/1993 | Mattes | 714/805 |
| 5,790,561 A | * | 8/1998 | Borden et al. | 714/724 |
| 5,831,992 A | * | 11/1998 | Wu | 714/732 |
| 6,055,660 A | * | 4/2000 | Meaney | 714/732 |

(Continued)

FOREIGN PATENT DOCUMENTS
DE    19722157 A1    12/1998

OTHER PUBLICATIONS

M. Goessel et al., "Signature Analysis for Identifying Failing Vectors", XP 002317738, 4 pps.

(Continued)

*Primary Examiner* — Jeffrey A Gaffin
*Assistant Examiner* — Daniel McMahon
(74) *Attorney, Agent, or Firm* — Dicke, Billig & Czaja, PLLC

(57) ABSTRACT

An evaluation circuit and method for detecting faulty data words in a data stream is disclosed. In one embodiment the evaluation circuit according to the invention includes a first linear automaton circuit and also a second linear automaton circuit connected in parallel, each having a set of states z, which have a common input line for receiving a data stream $T_n$. The first linear automaton circuit and the second linear automaton circuit are designed such that a first signature and a second signature, respectively, can be calculated. Situated downstream of the two linear automaton circuits are respectively a first logic combination gate and a second logic combination gate, which compare the signature respectively calculated by the linear automaton circuit with a predeterminable good signature and output a comparison value.

23 Claims, 3 Drawing Sheets

U.S. PATENT DOCUMENTS

| | | | | |
|---|---|---|---|---|
| 6,194,910 | B1* | 2/2001 | Davis et al. | 324/765 |
| 6,483,373 | B1* | 11/2002 | Lim et al. | 327/525 |
| 7,391,349 | B2* | 6/2008 | Dworski et al. | 341/120 |
| 2001/0052786 | A1* | 12/2001 | Eldridge et al. | 324/765 |
| 2002/0153918 | A1* | 10/2002 | Beer | 324/765 |
| 2004/0003329 | A1* | 1/2004 | Cote et al. | 714/726 |
| 2004/0246337 | A1* | 12/2004 | Hasegawa et al. | 348/189 |

OTHER PUBLICATIONS

M. Goessel et al., "A Parity-Preserving Multi-Input Signature Analyzer and its Application for Concurrent Checking and BIST", Journal of Electronic Testing, vol. 8, Nr. 2, Mar. 27, 1995, pp. 165-176 (XP000598709).

Y. Wu et al., "Scan-Based Bist Fault Diagnosis", IEEE Transactions on Computer-Aided Design of Integrated Circuits and Systems, vol. 18, No. 2, Feb. 1999, pp. 203-211.

"http://www.adobe.com/products/acrobat/readstep2.html" vom Dec. 17, 2001.

Dr. Techn. Manfred Gerner et al., "Self-testing Digital Circuits", R. Oldenbourg Verlag Munich Vienna 1990, 37 pages.

* cited by examiner

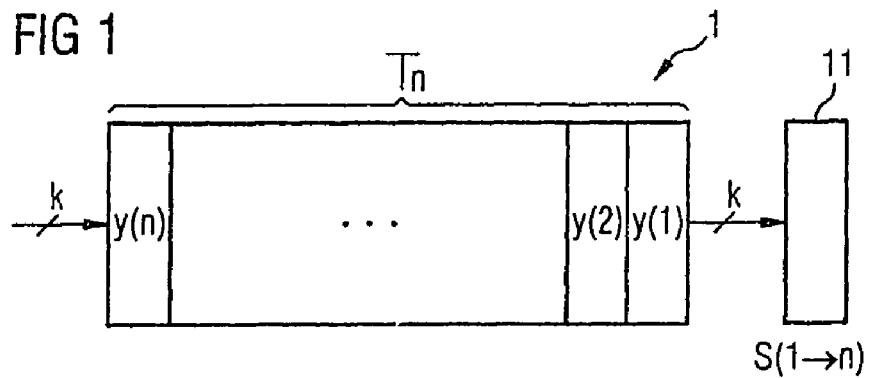
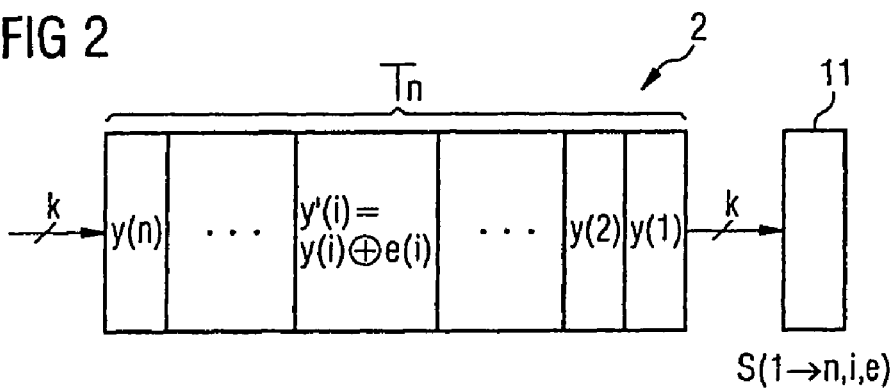
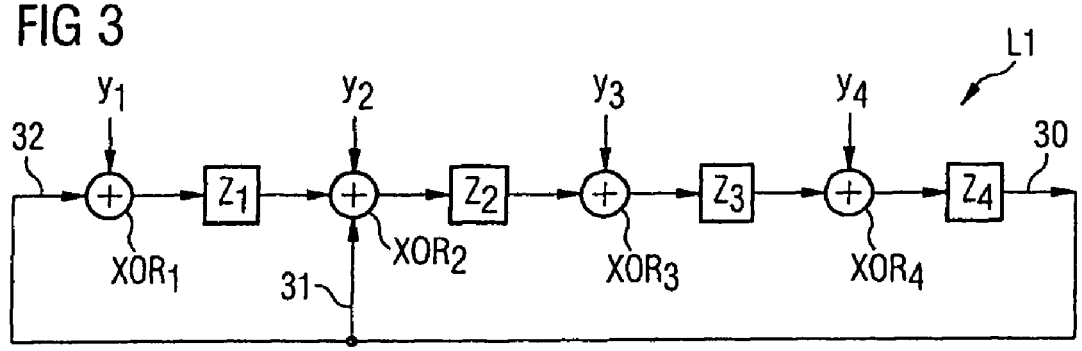
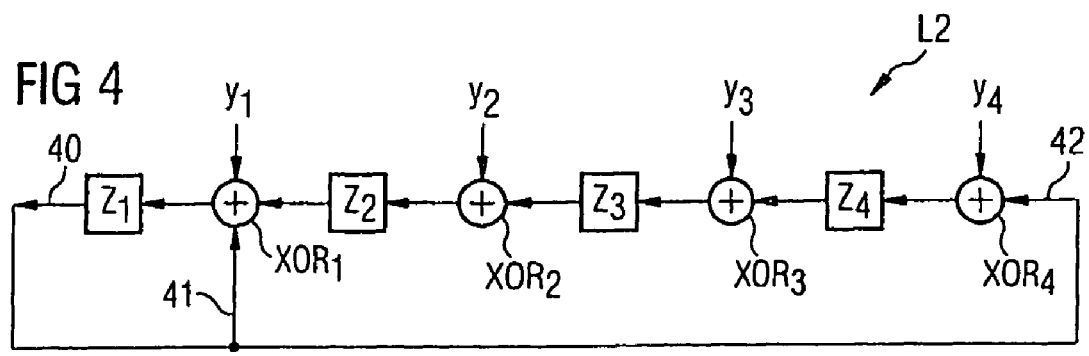

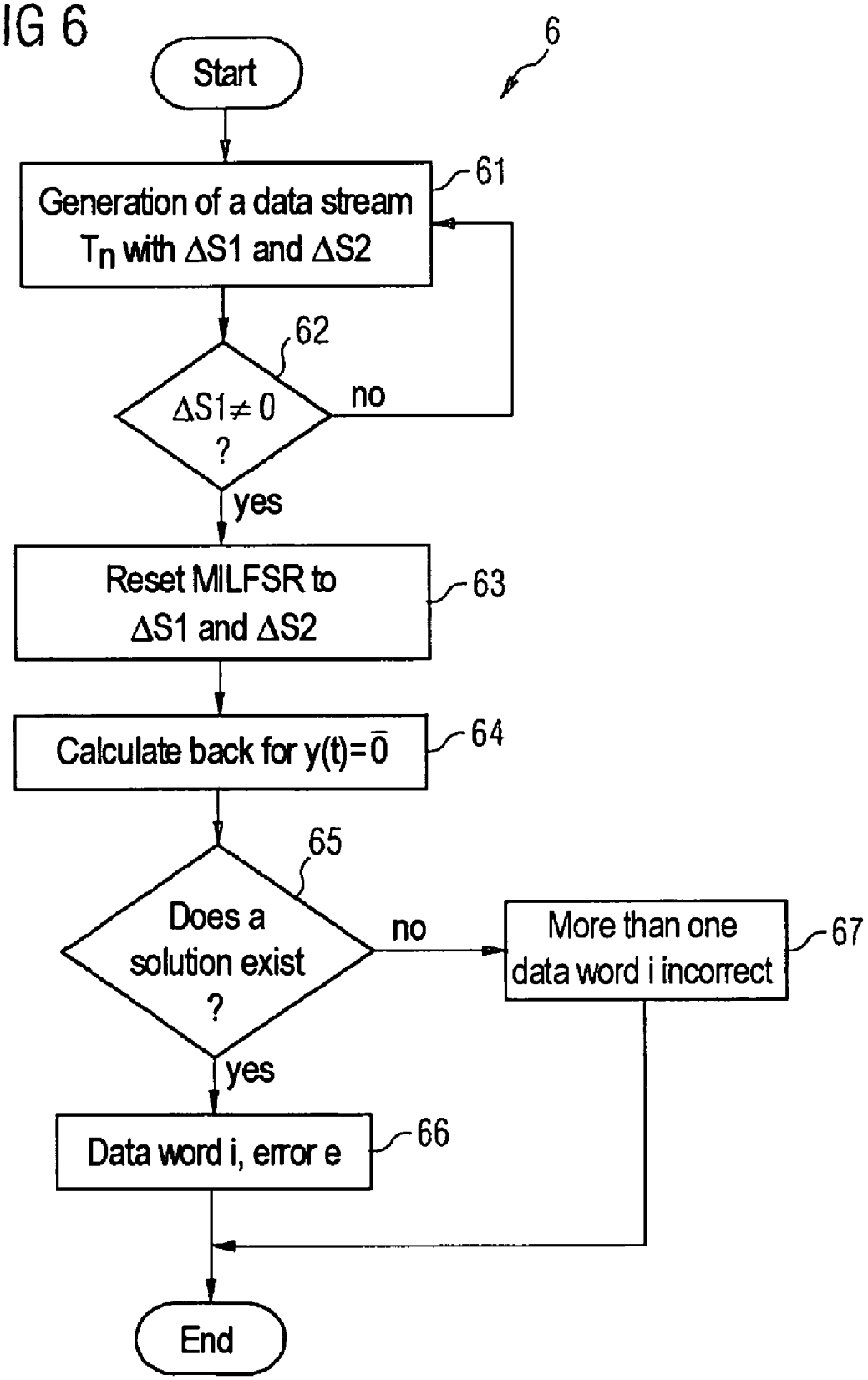

EVALUATION CIRCUIT AND METHOD FOR DETECTING AND/OR LOCATING FAULTY DATA WORDS IN A DATA STREAM $T_n$

CROSS REFERENCE TO RELATED APPLICATION

This Utility Patent Application claims the benefit of the filing date of German Application No. DE 103 49 933.4, filed Oct. 24, 2003, and International Application No. PCT/DE2004/002362, filed Oct. 22, 2004, both of which are herein incorporated by reference.

FIELD OF INVENTION

Evaluation circuit and method for detecting and/or locating faulty data words in a data stream $T_n$.

BACKGROUND

Integrated circuits, in particular fast digital interface circuits/interfaces are often subjected to one or more production tests as early as during the production method, in which production test or production tests test patterns are applied to the integrated circuit and the data stream generated by the integrated circuit in a manner dependent on said test patterns is examined.

Production tests in which faulty integrated circuits can be reliably discovered and sorted out in good time have a comparatively long duration and require a high complexity.

In customary production tests, in which the data streams are compressed or compacted for time and cost reasons, it is often not possible for faulty integrated circuits to be ascertained as early as during a production test, so that faulty integrated circuits often pass through even further manufacturing stations before being identified as faulty. If faulty integrated circuits are not identified during the production test or production tests, but only at a later point in time in the production method, high costs arise e.g., due to the reduced production yield.

If a faulty circuit has been identified with production tests operating with compressed or compacted data streams, it is still not possible to make a statement about which location or which region caused this error. This has to be detected by sorting out the faulty circuit and by means of a separate test run.

SUMMARY

The present invention provides a device and also a method enabling production accompanying checking of integrated circuits, in the case of which errors present in the tested circuits can be reliably identified and precisely located.

In one embodiment, the evaluation circuit according to the invention is provided for detecting and/or locating faulty data words in a data stream $T_n$. It has a first linear automaton circuit and also a second linear automaton circuit connected in parallel, each having a set of states $z(t)$. These linear automaton circuits are, in particular, linear feedback shift registers having a multiple input linear feedback shift register architecture/MILFSR architecture.

Both linear automaton circuits are equipped with a common input line for receiving a data stream $T_n$ comprising n successive data words $y(1), \ldots, y(n)$ each having a width of k bits. Arbitrary test data can be applied to said input line, it being necessary for the good signature of the ideal error-free test data to be known. The first linear automaton circuit is described by the equation $$z(t+1)=Az(t)\oplus y(t)$$

and the second linear automaton circuit is described by the equation $$z(t+1)=Bz(t)\oplus y(t)$$

In this case, A and B represent the state matrices of the linear automaton circuits.

The two linear automaton circuits can calculate a first signature S1 and a second signature S2, respectively, either directly from the data words $y(1), \ldots, y(n)$ of the data stream $T_n$ or, if appropriate, from already coded data words $u^1(1), \ldots, u^1(n)$ and $u^2(1), \ldots, u^2(n)$, respectively.

In this document, signature is understood to mean a compacting of a set of data words. From these signatures it is possible to calculate back to the faulty data words.

These calculated signatures S1 and S2 are compared in each case with an error-free good signature by means of a first logic combination gate arranged downstream of the first linear automaton circuit and by means of a second logic combination gate arranged downstream of the second linear automaton circuit. At the outputs of the logic combination gates, it is possible to tap off a comparison value with the good signatures, which enables a conclusion to be drawn regarding whether the data stream $T_n$ under consideration has no, one or more faulty data words $y'(i)$.

In accordance with a basic concept of the invention, the number of faulty data words $y'(i)$ in the data stream $T_n$ can thus be deduced directly from the signatures of a data stream $T_n$.

If, in the data stream $T_n$, precisely one faulty data word $y'(i)$ is present in the i-th position of the data stream, which faulty data word differs from the error-free data word $y(i)$ by the error word $e(i)$, $y'(i)=y(i)\oplus e(i)$, which is also referred to hereinafter simply as error, where $\oplus$ designates componentwise addition modulo 2, it is possible according to the invention to determine the position i of the faulty data word $y'(i)$ in the data stream and the error $e(i)$ directly from the differences between the signatures S1 and S2 and the corresponding error-free signatures.

The test patterns which, during a production test, are to be transmitted continuously to an output unit and are to be examined are therefore reduced by two or more orders of magnitude in accordance with the invention. For locating errors it is no longer necessary to carry out a comparison of all the data words with the respectively known error-free data words, that is to say a total of 2 times n data words.

It is likewise possible to conduct production accompanying error statistics and to evaluate them in order to establish whether faulty components can be detected by means of a data stream reduced in this way.

In a first embodiment of the evaluation circuit, the logic combination gates are designed as exclusive-OR gates whose first input is respectively connected to the output of the associated linear automaton circuit and to whose second input a good signature is to be applied.

According to the invention, the data stream $T_n$ comprising n data words is compacted into two signatures S1 and S2 in two different linear feedback shift registers having k parallel inputs. From the two known good signatures GS1 and GS2 of the two shift registers for the error-free data stream $T_n$, the signature differences $\Delta S1=GS1\oplus S1$ and $\Delta S2=GS2\oplus S2$ are produced by means of exclusive O-Ring with the signatures S1 and S2 actually determined. These signature differences ΔS1 and ΔS2 are used to determine, for the case where only one data word in the data stream is faulty, the position i of the faulty data word y'(i) in the data stream $T_n$ and the error word e(i), which describes the deviation of the faulty data word y'(i) from the correct data word y(i), y'(i)=y(i)⊕(i).

If errors are present in two or more, arbitrarily many data words, then it emerges from the signature differences ΔS1 and ΔS2 as the result of the evaluation circuit according to the invention that the data stream $T_n$ is faulty.

In a second embodiment of the invention, the evaluation circuit is provided with a first coder arranged upstream of the first linear automaton circuit. Said first coder codes the data word y(i) having the data word length of k bits for i=1, ..., n into a coded data word $u^1(i)$, $u^1(i)$=Cod1(y(i)) having the word width of K1 bits. In this case, Cod1 is the coding function of the first coder.

In this case, the coding function Cod1 of the first coder may be configured such that a function $f_1$ where $f_1(0)=\bar{0}$ exists for y'(i)=y(i)⊕e(i), that Cod1(y'(i))=Cod1(y(i)⊕e(i))=Cod1(y(i)⊕$f_1$(e(i))) or Cod1(y'(i))=$u^1(i)$⊕$f_1$(e(i)) holds true, and that there is a function $f_1^{-1}$, where $f_1^{-1}(f_1(e))$=e, for all possible k-digit binary words e, where e is an error word by which a faulty data word in the data stream $T_n$ may deviate from a correct data word.

In a further embodiment of the invention, the evaluation circuit is provided with a second coder arranged upstream of the second linear automaton circuit. Said second coder codes the data word y(i) having the data word length of k bits for i=1, ..., n into a coded data word $u^2(i)$, $u^2(i)$=Cod2(y(i)) having the word width of K2 bits. In this case, Cod2 is the coding function of the second coder.

In this case, the coding function Cod2 of the second coder may be configured such that, for y'(i), it holds true that y'(i)=y(i)⊕e(i))=Cod2(y(i)) ⊕$f_2$(e(i)) or Cod2(y'(i))=$u^2(i)$⊕$f_2$(e(i)) and that a function $f_2^{-1}$ where $f_2^{-1}(f_2(e))$=e exists.

The coders may also be realized as continuous lines and effect an identical mapping:

Cod1(y(i))=Cod2(y(i)))=y(i) for i=1, ..., n

This configuration corresponds to the already described evaluation circuit without coders.

The evaluation is simplified if the word width K1 of the data words $u^1(i)$ coded by the first coder is equal to the word width K2 of the data words $u^2(i)$ coded by the second coder, if the first coder matches the second coder with regard to its construction and its function, and if the word width K1 of the data words $u^1(i)$ coded by the first coder and the word width K2 of the data words $u^2(i)$ coded by the second coder are in each case equal to the word width k of the data words y(1), ..., y(n) of the data stream $T_n$.

In an advantageous development of the invention, the coding functions Cod1 and Cod2 of the first coder and of the second coder may be designed as follows:

Cod1($y_1(i), y_2(i), ..., y_k(i)$)=P1($y_1(i), y_2(i), ..., y_k(i)$, 0, ..., 0)

Cod2($y_1(i), y_2(i), ..., y_k(i)$)=P2($y_1(i), y_2(i), ..., y_k(i)$, 0, ..., 0)

for i, 1, ..., n

In this case, the number of zeros situated at the end of P1($y_1(i), y_2(i), ..., y_k(i)$, 0, ..., 0) is equal to (K1−k), and the number at the end of P2($y_1(i), y_2(i), ..., y_k(i)$, 0, ..., 0) is equal to (K2−k). P1 represents an arbitrary permutation of the K1 components of ($y_1(i), y_2(i), ..., y_k(i)$, 0, ..., 0) and P2 represents an arbitrary permutation of the K2 components of ($y_1(i), y_2(i), ..., y_k(i)$, 0, ..., 0).

In this case, only k bits of $y_1(i), ..., y_k(i)$ are input into the K1=K2=k+1 bit wide state vectors of the linear automaton circuits by means of XOR elements. No XOR elements are required for inputting the constant values 0. This ensures simple adaptation of the word width of the data words to the word width of the states.

In practice, zeros are in this case inserted into the k-bit data word $y_1(i), ..., y_k(i)$=y(i) at (K1−k) locations and, respectively, at (K2−k) locations. The components may also be interchanged by means of the permutations in this case. As a result, the dimension of the linear automaton circuits becomes equal to K1>k, K2>k. The probability of an incorrectly identified error thus becomes lower.

In an alternative instance of the evaluation circuit, the coding functions Cod1 and Cod2 of the first coder and of the second coder are designed as follows:

Cod1($y_1(i), y_2(i), ..., y_k(i)$)=P1($y_1(i), y_2(i), ..., y_k(i)$, $b_1^1, ..., b_{K1-k}^1$)

Cod2($y_1(i), y_2(i), ..., y_k(i)$)=P2($y_1(i), y_2(i), ..., y_k(i)$, $b_1^2, ..., b_{K2-k}^2$)

where $b_1^1, ..., b_{K1-k}^1, b_1^2, ..., b_{K2-k}^2 \in \{0,1\}$. In this case, P1 and P2 represent arbitrary permutations. In the practical implementation of this instance of the invention, zeros and ones are inserted into the data word $y_1(i), ..., y_k(i)$=y(i) at K1−k (K2−k) locations.

It is particularly advantageous if the coding function Cod1 of the first coder and/or the coding function Cod2 of the second coder are designed such that they realize a linear block code, $f_1$=Cod1 and $f_2$=Cod2, respectively. Linear block codes known to the person skilled in the art may be designed e.g., as Hamming codes, as parity bit codes or as group parity bit codes.

The detecting and the locating of faulty data words in a data stream $T_n$ can be simplified by choosing the linear automaton circuits such that their state matrices A and B are related to one another as follows:

$B=A^n$, where n≠1, or if the state matrix B of the second linear automaton circuit is equal to the inverted state matrix $A^{-1}$ of the first linear automaton circuit $B=A^{-1}$ In a further embodiment of the evaluation circuit, the first linear automaton circuit is present as a linear feedback shift register and the second linear automaton circuit is present as an inverse linear feedback shift register. In this case, both linear automaton circuits have a parallel input.

The linear automaton circuits may also be present as linear feedback, K1-dimensional and, respectively, K2-dimensional multi-input shift registers, in particular of maximum length.

The invention also relates to a method for detecting faulty data words y'(i) in a data stream $T_n$ comprising n data words y(1), ..., y(i−1), y'(i), y(i+1), ..., y(n) having the data word width k and/or for locating a faulty data word y'(i)=and a faulty position i of a faulty data word y'(i)=y(i)⊕e(i).

In this case, the data stream $T_n$ deviates in the i-th position by e(i) from the correct data stream y(1), ..., y(i−1), y(i), y(i+1), ..., y(n).

In this case, firstly the data words of the data stream $T_n$ are input into a first coder having the coding function Cod1 and the decoding function Decod1. The first coder codes the data words y(1), ..., y(i−1), y'(i), y(i+1), ..., y(n) into the coded data words $u^1(1), \ldots, u^1(i-1), u^{1'}(i), u^1(i), \ldots, u^1(n)$ having the word width K1 where $K1 \geq k$.

For $y'(i)=y(i) \oplus e(i)$, a function $f_1$ exists in such a way that $f_1(0)=0$ and $Cod1(y'(i))=Cod1(y(i) \oplus e(i))=Cod1(y(i) \oplus f_1(e(i)))$ hold true, and that there is a function $f_1^{-1}(f(e))=e$ for all fundamentally possible k-digit errors where $f_1^{-1}(f_1(e))$.

The data words coded in this way are then input into the inputs of a first linear automaton circuit with K1-dimensional state vector $z^1$.

The first linear automaton circuit is described by the automaton equation $$z^1(t+1)=A \cdot z^1(t) + u^1(t) \qquad (I)$$

Its matrix A is in the form of K1×K1 matrix with binary coefficient, so that an inverse matrix $A^{-1}$ exists and the additions and multiplications in (1) are effected modulo 2.

When $y(1), \ldots, y(i-1), y(i), y(i+1), \ldots y(n)$ is input into the coder and thus when $u^1(1), \ldots, u^1(i-1), u^1(i), u^1(i+1), \ldots, u^1(n)$ is input into the first linear automaton circuit, the first linear automaton circuit undergoes transition to the state $z^1(n+1)=S(L1, y(1), \ldots, y(i-1), y(i), y(i+1), \ldots, y(n))$.

When the input $y(1), \ldots, y(i-1), y'(i), \ldots, y(n)$ that is faulty in the i-th position is input into the coder and thus when $u^1(1), \ldots, u^1(i-1), u^{1'}(i), \ldots, u^1(n)$ is input into the first linear automaton circuit, the latter undergoes transition to the state $z^{1'}(n+1)=S(L1, y(1), \ldots, y(i-1), y'(i), y(i+1), \ldots, y(n))$.

In this case, the signatures of the correct and faulty data sequences are respectively designated by $S(L1, y(1), \ldots, y(i-1), y(i), y(i+1), \ldots, y(n))$ and by $S(L1, y(1), \ldots, y(i-1), y'(i), y(i+1), \ldots, y(n))$.

This signature of the data stream $T_n$ can be compared with a known good signature. If this comparison yields no deviation indicating at least one faulty data word $y'(i)$, then the data stream $T_n$ is with high probability free of errors. In this case, the method according to the invention is begun from the outset again with a new data stream $T_n$.

If, by contrast, a deviation indicating at least one faulty data word $y'(i)$ is detected, then the method continues with the next method step, in which the data words $y(1), \ldots, y(i-1), y'(i), \ldots, y(n)$ of the data stream $T_n$ are input in a second coder having the coding function Cod2 and the decoding function Decod2.

The inputting of the data stream $T_n$ into the second coder is in practice usually effected at the same time as the inputting into the first coder. If the same data stream $T_n$ can also be made available twice in a temporally offset fashion, the inputting into the coders may also be effected one after the other. In this embodiment, it is advantageous that only one coder and only one linear automaton circuit have to be available, which are used twice in succession for the same data stream $T_n$.

In this case, the second coder and the second automaton circuit may be obtained by means of a simple modification from the first coder and from the first automaton circuit.

The second coder codes the data words $y(1), \ldots, y(i-1), y'(i), y(i+1), \ldots, y(n)$ into the coded data words $u^2(1), \ldots, u^2(i-1), u^{2'}(i), u^2(i+1)$ having the data word width K2, $K2 \geq k$.

The following holds true in this case for $y'(i)$:

$$Cod2(y'(i))=Cod2(y(i) \oplus e(i))=Cod2(y(i)) \oplus f_2(e(i))$$

A function $f_2^{-1}$ where $f_2^{-1}(f_2(e))=e$ exists.

The data words coded in this way are input into the inputs of a second linear automaton circuit with K2-dimensional state vector $z^2$. The latter is described by the following automaton equation:

$$z^2(t+1)=B \cdot z^2(t) \oplus u^2(t) \qquad (VII)$$

The matrix B of the second linear automaton circuit where $B \neq A$ is a K2×K2 matrix with binary coefficient for which an inverse matrix $B^{-1}$ exists. The additions and multiplications in (VII) are effected modulo 2.

When the correct data sequence $y(1), \ldots, y(i-1), y(i), y(i+1), \ldots, y(n)$ is input into the second coder and when the coded sequence $u^1(1), \ldots, u^1(i-1), u^1(i), u^1(i+1), \ldots, u^1(n)$ is input, the second linear automaton circuit undergoes transition to the state $z^2(n+1)=S(L2, y(1), \ldots, y(i-1), y(i), y(i+1), \ldots, y(n))$.

When the faulty data sequence $y(1), \ldots, y(i-1), y'(i), y(i+1), \ldots, y(n)$ is input into the second coder and when the coded sequence $u^2(1), \ldots, u^2(i-1), u^{2'}(i), u^2(i+1), \ldots, u^1(n)$ is input into the second linear automaton circuit, the latter undergoes transition to the state $z^{2'}(n+1)=S(L2, y(1), \ldots, y(i-1), y(i), y'(i), y(i+1), \ldots, y(n))$.

In this case, the signatures of the correct and faulty data sequences are respectively designated by $S(L2, y(1), \ldots, y(i-1), y(i), y(i+1), \ldots, y(n))$ and by $S(L2, y(1), \ldots, y(i-1), y'(i), \ldots, y(n))$.

The signature differences $\Delta S1$ and $\Delta S2$ can now be determined, to be precise from the determined signatures S1 and S2 and from the predetermined good signatures. This calculation of the signature differences $\Delta S1$ and $\Delta S2$ is effected e.g., by componentwise exclusive-ORings of the signatures S1 and S2 with the predetermined good signatures.

The signature differences $\Delta S1$ and $\Delta S2$ are defined as follows.

$$\Delta S1 = S(L1, y(1), \ldots, y(i-1), y(i), y(i+1), \ldots, y(n)) \oplus S(L1, y(1), \ldots, y(i-1), y'(i), y(i+1), \ldots, y(n))$$

and $$\Delta S2 = S(L2, y(1), \ldots, y(i-1), y(i), y(i+1), \ldots, y(n)) \oplus S(L2, y(1), \ldots, y(i-1), y'(i), y(i+1), \ldots, y(n))$$

In this case, the signatures are XORed in a componentwise fashion.

The following method can be performed by an external calculation unit, e.g., a computer system, using the values determined up to this point in time in the method.

It is then possible, if precisely one faulty data word is present, to calculate back to its position i, to be precise by determining a unique solution for the position i of the faulty data word by solving the equation $$f_1^{-1}(A^{i-n} \cdot \Delta S1) = f_2^{-1}(B^{i-n} \cdot \Delta S2) \qquad (XVI)$$

The value of the position i can be uniquely determined from equation (XVI).

If no unique solution results for i, an output medium outputs a notification that two or more errors are present in the data stream $T_n$ under consideration.

If the value of the position i has been calculated, then it is also possible to determine a unique solution for all the bits of the faulty data word $e(i)$ in the data stream $T_n$, to be precise by solving the equation $$e(i) = f_1^{-1}(A^{i-n} \cdot \Delta S1) \qquad (XIV)$$

The value for $e(i)$ is defined from equation (XIV) for the value determined from (XVI) for $i \in \{1, \ldots, n\}$).

The position i of the faulty data word $y'(i)$ and also the errors e in the data stream $T_n$ may be made available by an output medium, e.g., by a screen or by a printer.

The method described above can be carried out by means of an evaluation circuit according to the invention that has already been described whose outputs at which the signature differences $\Delta S1$ and $\Delta S2$ are provided are connected, if appropriate, to an external calculation unit, e.g., a computer system, which carries out the calculating-backprocess.

The invention also relates to an integrated circuit to be tested on which is contained an evaluation circuit according to the invention in one of the embodiments described above, in particular in addition to the normal circuit as it were as an add-on. In this case, the evaluation circuit according to the invention is monolithically integrated on the integrated circuit or on the semiconductor component.

The invention also relates to a needle card for testing integrated circuits, in which is integrated an evaluation circuit according to the invention in one of the embodiments described above.

The invention furthermore relates to a tester-specific loadboard with test holders for inserting integrated circuits or for receiving such a needle card or for connecting a handler, at least one evaluation circuit according to the invention in one of the embodiments described above being integrated on the loadboard. Such a loadboard may also be referred to as an adaptor board.

The evaluation circuit according to the invention may also be integrated directly on a tester/measuring device/test system/automatic test machine for testing integrated circuits. Such a tester is provided with a plurality of instruments for generating signals or data streams and with a plurality of measuring sensors, in particular for currents and voltages, and the tester has a loadboard which is provided for receiving at least one needle card for testing integrated circuits and/or for connecting a handler to a tester of integrated circuits and/or which is equipped with at least one test socket for testing integrated circuits.

In accordance with a further basic concept of the invention, the evaluation circuit according to the invention, in all the embodiments described above, can be provided simply and in a very space-saving manner on all possible circuits or devices in any abstraction level or at any measuring device level. Adverse effects on the functioning do not arise in this case. The concrete configuration of the above-described subject matters with such an evaluation circuit emerges for the person skilled in the art completely and unambiguously from the information contained in this patent specification and also from his expert knowledge. In this case, it is merely necessary to take account of the fact that the evaluation circuit according to the invention is in each case to be applied in addition to the circuits contained on the abovementioned subject matters. The invention is also realized in a computer program for executing the method for detecting and/or locating faulty data words in a data stream $T_n$. In this case, the computer program contains program instructions that cause a computer system to execute such a test method in an embodiment described above.

In this case, in particular the method of generating and inputting data words $y(1), \ldots, y(i-1), y'(i), y(i+1), \ldots, y(n)$ of a data stream $T_n$ into the evaluation circuit and also calculating back to the position of the faulty data word $y'(i)$ and the error e from the signature differences $\Delta S1$ and $\Delta S2$ are controlled by means of a computer system or carried out on a computer system itself. The computer program outputs the results as digital data sequences or in a form of representation generated therefrom on an output unit, in particular on a screen or on a printer, or stores these result data in a memory area. The computer program according to the invention enables faulty data words to be determined rapidly, effectively and reliably, resulting in a significant acceleration of the test execution time.

The invention additionally relates to a computer program which is contained on a storage medium, in particular in a computer memory or in a random access memory, or which is transmitted on an electrical carrier signal. The invention also relates to a carrier medium, in particular a data carrier, such as, for example, a floppy disk, a Zip drive, a streamer, a CD or a DVD, on which a computer program described above is stored. Furthermore, the invention relates to a computer system on which such a computer program is stored. Finally, the invention also relates to a download method in which such a computer program is downloaded from an electronic data network, such as e.g., from the Internet, onto a computer connected to the data network.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention is illustrated in more detail in the drawings on the basis of an exemplary embodiment.

FIG. 1 illustrates a first measurement data flow representation with n error free data words $y(1), y(2), \ldots, y(n;$ FIG. 2 shows a second measurement data flow representation with a faulty measurement data word $y'(i)$;

FIG. 3 illustrates a schematic illustration of a first linear automaton circuit;

FIG. 4 illustrates a schematic illustration of a second linear automaton circuit;

FIG. 6 illustrates a flowchart for illustrating the method according to the invention for detecting an error $e(i)$ in a data word $y(i)$.

DETAILED DESCRIPTION

Figure 5:
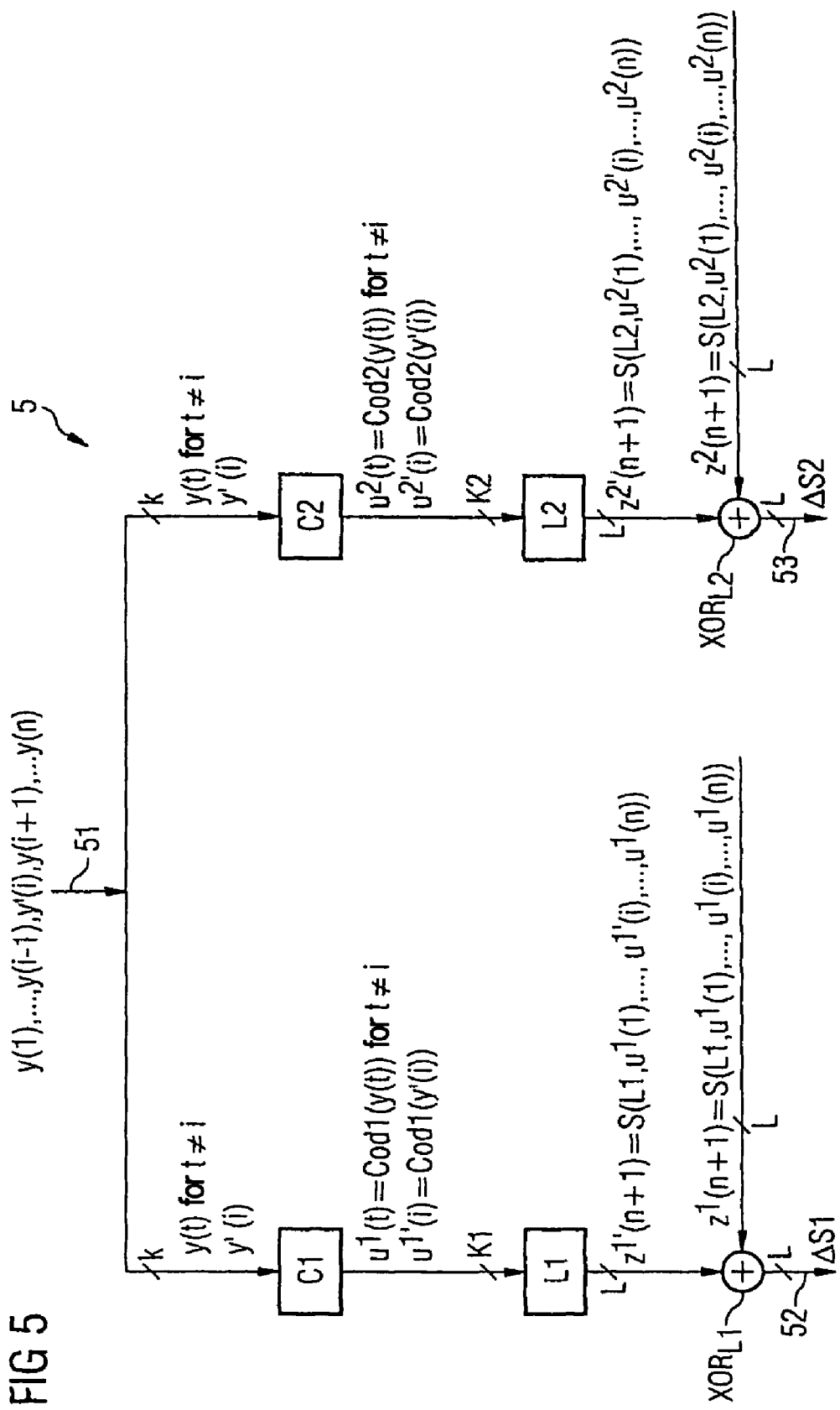
FIG. 5 illustrates a sequential scheme for determining signature differences $\Delta S1$ and $\Delta S2$ from a measurement data stream $T_n$.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates a first measurement data flow representation 1.

The first measurement data flow representation 1 comprises a pseudorandom measurement data stream $T_n$, which is illustrated in rectangular fashion in FIG. 1 and is subdivided into n successive data words $y(1), y(2), \ldots, y(n)$ each having an identical data word length of k bits.

An input having the bit width k is shown on the left of the first measurement data flow representation 1, at which input the measurement data words y(1), y(2), ..., y(n) are output e.g., from a tested integrated circuit in each case in clocked fashion. Therefore, the measurement data words having the higher indices are arranged further on the left in FIG. 1. Such a tested integrated circuit is also referred to hereinafter as Device Under Test/DUT.

An output having the bit width k is illustrated on the right of the first measurement data flow representation 1, via which output the measurement data are forwarded to a shift register 11. The shift register 11 is a shift register with a multiple input linear feedback shift register architecture or with an MILFSR architecture. All n data words are intended to be compressed in a single data word having the length of k bits by means of the shift register 11. The specification for the mapping of n data words y(1), y(2), ..., y(n) into a single signature is given in equation (1).

$$S(1 \to n) = S(y(1), y(2), \ldots, y(n)) \quad (1)$$

The initial state $z(t_0)$ of the shift register 11 with the MILFSR architecture is given by the zero vector 0, $z(t_0)=0$.

FIG. 2 illustrates a second measurement data flow representation 2 with a faulty measurement data word y'(i).

The second measurement data flow representation 2 differs from the first measurement data flow representation 1 by virtue of the fact that its data stream $T_n$ has an error e(i) in the i-th data word y'(i) of the data stream $T_n$.

If such an error e(i) is present in the data word y'(i) of the data stream $T_n$, the specification for the mapping of n data words y(1), y(2), ..., y(n) by the signature of the shift register 11 is given by equation (2).

$$S(1 \to n, i, e) = S(y(1), y(2), \ldots, e(i), \ldots, y(n)) \quad (2)$$

This signature is then generated from the data words y(1), y(2), ..., e(i), ..., y(n) by means of the shift register 11. The shift register 11 has the MILFSR architecture already mentioned with reference to FIG. 1.

Through skillful comparison of the signatures S(y(1), y(2), ..., e(i), ..., y(n)) in equation (1) and S(y(1), y(2), ..., e(i), ..., y(n)) in equation (2), it is possible to calculate back to the position i of the faulty data word y'(i) and to the error e(i), that is to say to all of its faulty bits e(i).

If a known digital test response of a DUT contains precisely one error e(i) in the i-th data word of the data stream, then the data word y'(i) and all the faulty bits of its error e(i) can be obtained with the aid of the mapping $S(1 \to n, i, e)$ calculated from an MILFSR architecture. This is done at an instant t>n at which the data words y(1), y(2), ..., y(n) of the data stream $T_n$ are no longer available or are no longer required.

In accordance with the present invention, only 2 signatures, that is to say 2 k-bit data words, need be evaluated for the test, for the diagnosis and for the error correction of an error in an arbitrary data word of the data stream $T_n$ comprising n k-bit data words.

FIG. 3 illustrates a schematic illustration of a first linear automaton circuit L1.

The first linear automaton circuit L1 comprises four states $z_1$, $z_2$, $z_3$ and $z_4$, which are illustrated in rectangular fashion in FIG. 3 and are arranged respectively one after the other and are stored in storage elements, e.g., D-type flip-flops. Provided upstream of the first state $z_1$ and in each case between the states $z_2$, $z_3$ and $z_4$ are four exclusive-OR gates $XOR_1$, $XOR_2$, $XOR_3$ and $XOR_4$, the first inputs of which are respectively formed by four measurement data lines $y_1$, $y_2$, $y_3$ and $y_4$ and the outputs of which are connected to the respective subsequent states $z_1$, $z_2$, $z_3$ and $z_4$.

The second input of the second OR gate $XOR_2$ is connected to the output of the first state $z_1$. The second input of the third OR gate $XOR_3$ is formed by the output of the second state $z_2$. The second input of the fourth OR gate $XOR_4$ is formed by the output of the third state $z_3$.

Attached to the output of the fourth state $z_4$ is a first output line 30, which forks into a first feedback line 31 and into a second feedback line 32. The first feedback line 31 forms the third input of the second XOR gate $XOR_2$, and the second feedback line 32 forms the second input of the first XOR gate $XOR_1$.

The first linear automaton circuit L1 is accordingly designed as a shift register exhibiting feedback with a primitive polynomial and having four states $z_1$, $z_2$, $z_3$ and $z_4$.

The state equations of the first linear automaton circuit L1 are calculated from the states z(t+1) at the instant t+1 in a manner dependent on the states z(t) at the instant t. Equations (3)-(6) hold true for the first linear automaton circuit L1:

$$z_1(t+1) = z_4(t) \oplus y_1(t) \quad (3)$$

$$z_2(t+1) = z_1(t) \oplus z_4(t) \oplus y_2(t) \quad (4)$$

$$z_3(t+1) = z_2(t) \oplus y_3(t) \quad (5)$$

$$z_4(t+1) = z_3(t) \oplus y_4(t) \quad (6)$$

The following results with A as a state matrix:

$$z(t+1) = Az(t) \oplus y(t) \quad (7)$$

where $$A = \begin{bmatrix} 0 & 0 & 0 & 1 \\ 1 & 0 & 0 & 1 \\ 0 & 1 & 0 & 0 \\ 0 & 0 & 1 & 0 \end{bmatrix}, z(t+1) = \begin{bmatrix} z_1(t+1) \\ z_2(t+1) \\ z_3(t+1) \\ z_4(t+1) \end{bmatrix}, z(t) = \begin{bmatrix} z_1(t) \\ z_2(t) \\ z_3(t) \\ z_4(t) \end{bmatrix},$$

$$y(t) = \begin{bmatrix} y_1(t) \\ y_2(t) \\ y_3(t) \\ y_4(t) \end{bmatrix}$$

The autonomous behavior of the first linear automaton circuit L1 is calculated from equation (7) where y(t)=0 as $$z(t+1) = Az(t) \quad (8)$$

Equations (3)-(8) are also referred to as successor equations.

It follows from equations (3), (5) and (6), where $y_i(t)=0$ for $i \in \{1,2,3,\}$, that:

$$z_4(t) = z_1(t+1) \quad (9)$$

$$z_2(t) = z_3(t+1) \quad (10)$$

$$z_3(t) = z_4(t+1) \quad (11)$$

It follows from equation (9), inserted into equation (4), that:

$$z_2(t+1) = z_1(t+1) \oplus z_1(t)$$

and $$z_1(t+1) \oplus z_2(t+1) = z_1(t+1) \oplus z_1(t+1) \oplus z_1(t)$$

This results in the following:

$$z_1(t)=z_1(t+1)\oplus z_2(t+1) \tag{12}$$

Equations (9)-(12) are referred to as predecessor equations of the linear automaton circuit L1 for the input 0 or else as autonomous predecessor equations of the linear automaton circuit L1.

In matrix notation, the following predecessor equations are obtained analogously to the successor equations in (8) from (9)-(12)

$$z(t) = A^{-1}z(t+1) \tag{13}$$

$$\text{where } A^{-1} = \begin{bmatrix} 1 & 1 & 0 & 0 \\ 0 & 0 & 1 & 0 \\ 0 & 0 & 0 & 1 \\ 1 & 0 & 0 & 0 \end{bmatrix}$$

$A^{-1}$ is the inverse matrix with respect to A. Multiplication of A and $A^{-1}$ produces the unit matrix E.

$$A^{-1}A = E \text{ where } E = \begin{bmatrix} 1 & 0 & 0 & 0 \\ 0 & 1 & 0 & 0 \\ 0 & 0 & 1 & 0 \\ 0 & 0 & 0 & 1 \end{bmatrix}$$

FIG. 4 illustrates a schematic illustration of a second linear automaton circuit L2.

With regard to the signal direction, the second linear automaton circuit L2 is illustrated in mirrorinverted fashion with respect to the first linear automaton circuit L1.

Like the first linear automaton circuit L1, the second linear automaton circuit L2 comprises four states $z_1$, $z_2$, $z_3$, $z_4$, four exclusive-OR gates $XOR_1$, $XOR_2$, $XOR_3$ and $XOR_4$, and also four measurement data lines $y_1$, $y_2$, $y_3$ and $y_4$ which respectively form the first inputs of the exclusive-OR gates $XOR_1$, $XOR_2$, $XOR_3$ and $XOR_4$.

The exclusive-OR gates $XOR_1$, $XOR_2$, $XOR_3$ and $XOR_4$ are situated upstream of the fourth state $z_4$ and respectively between the states $z_1$, $z_2$ and $z_3$. The outputs of the exclusive-OR gates $XOR_1$, $XOR_2$, $XOR_3$ and $XOR_4$ are connected to the respective subsequent states $z_1$, $z_2$, $z_3$ and $z_4$.

The output of the first state $z_1$ forms a second output line 40, which is divided into a third feedback line 41 and into a fourth feedback line 42. The third feedback line 41 leads into the first exclusive-OR gate $XOR_1$ and the fourth feedback line 42 leads into the fourth exclusive-OR gate $XOR_1$.

Like the first linear automaton circuit L1, the second linear automaton circuit L2 is also designed as a shift register exhibiting feedback with a primitive polynomial and having four states $z_1$, $z_2$, $z_3$ and $z_4$.

The state equation of the second linear automaton circuit L2 is given in equation (15).

$$z(t+1) = Bz(t) \oplus y(t) \tag{15}$$

where $$B = \begin{bmatrix} 1 & 1 & 0 & 0 \\ 0 & 0 & 1 & 0 \\ 0 & 0 & 0 & 1 \\ 1 & 0 & 0 & 0 \end{bmatrix} = A^{-1} \tag{16}$$

B is the inverse matrix of A.

For an assumed error e(i) in a k-bit data word y'(i) of the data stream $T_n$ from FIG. 2, there is obtained from the mapping specification in accordance with equation (2)

$$S(1\to n,i,e)=S(y(1),y(2),\ldots,y(i)\oplus e(i),\ldots,y(n)) \tag{17}$$

and by application of the superposition principle in the case of linear automata $$S(1\to n,i,e)=S(y(1),y(2),\ldots,y(n))\oplus$$

$$S(0,0,\ldots,e(i),\ldots,0)$$

or $$S(1\to n,i,e)=S(1\to n)\oplus S(0,0,\ldots,e(i),\ldots,0)$$

the difference $$\Delta S1(i,e)=S(1\to n,i,e)\oplus S(1\to n) \tag{18}$$

where $$\Delta S1(i,e)=S(0,0,\ldots,e(i),\ldots,0) \tag{19}$$

for $y(t)=0$, for $t\neq i$ and $y(t)=e(i)$, for $t=i$

With equation (19) in equation (18) it follows that $$\Delta S1(i,e)=S((n-i)\to n,i,e)\oplus S((n-i)\to n) \tag{20}$$

At the instant $t=i-1$, as yet no error e(i) has occurred in the data word y'(i); it is not until from the instant $t=i$ that this error e(i) occurs in a k-bit data word.

For the formation of the signature from n data words y(1), y(2), ..., y(n) with precisely one assumed error e(i) in a data word y'(i), we obtain from equations (20) and (7)

$$\Delta S1(i,e)=A^{(n-1)}e(i); i\in\{1,2,\ldots,n\} \tag{21}$$

Equation (21) is the difference of two MILFSR signatures, namely of the signature of a 1-word faulty data stream $T_n$ at the position i and of the signature of an error-free data stream $T_n$. The signature difference $\Delta S1$ (i,e) is formed by a procedure in which the faulty data word y'(i) defines the initial state of the MILFSR architecture and is then accumulated (n−i) times in the MILFSR architecture with the inputting of all 0 vectors.

Upon transforming equation (21) with equation (16)

$$e(i)=B^{(n-i)}\Delta S1(i,e) \tag{22}$$

it becomes evident that the data word e(i) can be calculated as a new signature by a procedure in which the initial state of the second linear automaton circuit L2 is set at $\Delta S1(i,e)$ and is then accumulated (n−i) times.

According to the invention, inverted MILFSR architectures can thus be used for calculating 1-word errors e in data streams $T_n$ without it being necessary to still have these data streams available at the instant of calculating e(i).

From the equation corresponding to equation (20)

$$\Delta S2(i,e)=B^{(n-i)}e(i) \tag{23}$$

for the second linear automaton circuit L2, we obtain with equation (16) analogously to equation (20) the following equation (24). For an assumed 1-word error e(i), the following is obtained from equation (21) for the first linear automaton circuit L1

$$e(i)=A^{(n-1)}\Delta S2(i,e) \tag{24}$$

By equating equations (22) and (24), this results in $$A^{(n-i)}\Delta S2(i,e)=B^{(n-i)}\Delta S1(i,e) \tag{25}$$

Thus, if the initial state of the first linear automaton circuit L1 is set at $\Delta S2(i,e)$ or, respectively, if the initial state of the second linear automaton circuit L2 is set at $\Delta S1(i,e)$, and if this value is accumulated (n−i) times, then the error e(i) results as a new signature or as a new state in the case of both linear automaton circuits L1 and L2.

In this case, the value for the position i of the faulty data word y'(i) must lie between 1 and n.

If the equality of the expressions $A^{(n-i)}\Delta S2(i,e)$ and $B^{(n-i)} \Delta S1(i,e)$ results for none of the values i, $1 \leq i \leq n$, in equation (25), then an error e(i) which corrupts only the position i of the data word is not present, but rather an error which has corrupted at least two different positions in the data stream.

If $\Delta S1 \neq 0$ results, then it is possible, by resetting the linear automaton circuits L1 and L2 to $\Delta S2$ and $\Delta S1$, respectively, and by comparing the signatures accumulated in each step, to detect the position i of the faulty data word y'(i) and the error e(i) after n−i steps on both signatures or states. The signatures of the two linear automaton circuits L1 and L2 are equal in this case to $$z^1(n-i) = z^2(n-i) \quad (26),$$

where $z^1$ and $z^2$ are L-dimensional state vectors of the linear automaton circuits L1 and L2, and where $z^1(n-i)$ and $z^2(n-i)$ are the states of the two linear automaton circuits L1 and L2 after n−i clock cycles.

Given a serial data input, the following holds true for the two linear automaton circuits L1 and L2

$$y_i(t) = 0 \text{ for } i \neq 1 (L1) \quad (27)$$

$$y_i(t) = 0 \text{ for } i \neq k (L2) \quad (28)$$

In this case, k denotes the number of bits of a data word y(i) from the data stream $T_n$.

The comparison for identity of the signatures calculated back in this MILFSR architecture produces, for an assumed error e in the data word i after n−1 steps, $$z^1(n-i) = z^2(L+1-n+i) \quad (29)$$

FIG. 5 illustrates a sequential scheme 5 for determining signature differences $\Delta S1$ and $\Delta S2$ from a measurement data stream $T_n$.

Situated at the top side of the sequential scheme 5 is a measurement data word line 51, on which is present a data stream $T_n$ comprising n successive data words y(1), . . . , y(i−1), y'(i), y(i+1), . . . , y(n) each having an identical data word length of k bits. In this case, the data word y'(i) represents a faulty data word.

The measurement data word line 51 forks into two branches, the left-hand one of which has a first coder C1, the first linear automaton circuit L1, L exclusive-OR gates $XOR_{L1}$, which are combined in the form of an XOR gate having the word width L, and also a first output 52, at which the signature difference $\Delta S1$ is output. The right-hand branch comprises a second coder C2, the second linear automaton circuit L2, L exclusive-OR gates $XOR_{L2}$, which are likewise combined in the form of an XOR gate having the word width L, and also a second output 53, at which the signature difference $\Delta S2$ is output.

The respective L first inputs of the L exclusive-OR gates $XOR_{L1}$ are formed by the outputs of the first linear automaton circuit L1, and the first inputs of the L exclusive-OR gates $XOR_{L2}$ are formed by the outputs of the second linear automaton circuit L2.

Good signatures of the two linear automaton circuits L1 and L2 are provided at the second inputs of the L exclusive-OR gates $XOR_{L1}$ and $XOR_{L2}$ by means of digital circuits that are not shown in FIG. 5. Said good signatures can be determined for a known data stream $T_n$. This is known to the person skilled in the art.

The measurement data stream $T_n$ is input via the first coder C1 into the first linear automaton circuit L1 and, in parallel with this, via the second coder C2 into the second linear automaton circuit L2.

The data stream $T_n$ respectively present is transformed uniformly by means of the coders C1 and C2. As a result, it is possible also to compare data words y(1), . . . , y(n) of different data streams $T_n$ with one another.

The data words $u^1(1), \ldots, u^1(n)$ and $u^2(1), \ldots, u^2(n)$ coded by the coders C1 and C2 are compacted to form signatures S1 and S2 by means of the linear automaton circuits L1 and L2, respectively.

The actual signatures S1 and S2 thus determined are then compared with the known good signatures in the exclusive-OR gates $XOR_{L1}$ and $XOR_{L2}$. The respective L exclusive-OR gates $XOR_{L1}$ and $XOR_{L2}$ provide the signature differences $\Delta S1$ and $\Delta S2$ at the outputs 52 and 53.

According to the invention, these signature differences $\Delta S1$ and $\Delta S2$ can be used to ascertain whether errors have occurred in the case of the data stream $T_n$ respectively under consideration.

If the data stream $T_n$ has precisely one faulty data word y'(i), it is possible to directly determine both the position i of the faulty data word and the error e(i) of the faulty data word in the data stream.

The function of the first coder C1 is described precisely below.

The coder C1, for i=1, . . . , n, codes the data word y(i) having the data word length of k bits into a coded data word $u^1(i)$, $u^1(i)=\text{Cod}1(y(i))$ having the word width of K1 bits. In this case, Cod1 designates the coding function of the first coder C1.

If y'(i) is the component-by-component XOR sum of two k bit wide data words y(i) and e(i), namely $$y'(i) = y(i) \oplus e(i)$$

then the following is to hold true for the coding function Cod1

$$u^{1'}(i) = Cod1(y'(i)) = Cod1(y(i) \oplus e(i))$$
$$= Cod1(y(i)) \oplus f_1(e(i)) = u^1(i) \oplus f_1(e(i))$$

so that a function $f_1^{-1}$ where $$f_1^{-1}(f_1(e)) = e$$

holds true for all binary data words e having the word width k that are possible as errors.

If the coder C1 realizes a linear block code with k information positions and with (K1−k) check positions, then the following holds true $$Cod1(y'(i)) = Cod1(y(i) \oplus e(i))$$
$$= Cod1(y(i)) \oplus Cod1(e(i))$$

and it holds true that $$f_1 = Cod1.$$

Linear block codes are described e.g. in document [1].

If e.g., k=3 and K1=5 and it holds true that $$C1(y(i)) = C1([y_1(i), y_2(i), y_3(i)]^T)$$
$$= [y_1(i), y_2(i), y_3(i), 1, 1]^T,$$

then it holds true for $y'(i)=y(i)\oplus e(i)$ that:

$$Cod1(y'(i)) = Cod1(y(i) \oplus e(i))$$
$$= Cod1(y(i)) \oplus f(e(i))$$

where $$f_1(e(i))=f_1([e_1(i), e_2(i), e_3(i)]^T) [e_1(i), e_2(i), e_3(i), 0, 0]$$

and $$f_1^{-1}([e_1(i), e_2(i), e_3(i), 0, 0]^T)=e_1(i), e_2(i), e_3(i).$$

The function of the first linear automaton circuit L1 is described in detail below.

In the description below, the state matrix of the linear automaton circuits L1 and L2 may assume an arbitrary size and is not fixed at n=4, as described above. A further difference in the description below is that the input values of the linear automaton circuits L1 and L2 are coded data words $u^1(1), \ldots, u^1(n)$ and $u^2(1), \ldots, u^2(n)$, respectively, which have been coded by the first coder C1 and by the second coder C2, respectively, from the data words $y(1), \ldots, y(n)$.

The first linear automaton circuit L1 is formed over the field GF(2) and has a K1-dimensional state vector $z^1(t)$. $K1 \geq k$ holds true in this case.

The first linear automaton circuit L1 is generally described by the equation $$z^1(t+1)=A \cdot z^1(t) \oplus u^1(t) \quad (I)$$

In this case, $z^1(t)$ and $z^1(t+1)$ are K1-dimensional binary state vectors at the discrete instant t and t+1. $u^1(t)$ is the coded data word that is input at the instant t.

A is a uniquely reversible binary (K1×K1) matrix.

The addition and the multiplication of the binary values in equation (I) are effected modulo 2.

After the data stream $T_n$ comprising the n data words $y(1), \ldots, y(n)$ has been input into the first coder C1 and after the coded data words $u^1(i), \ldots, u^1(n)$ have been input into the first linear automaton circuit L1, the first linear automaton circuit L1 undergoes transition from an initial state $z^1(1)$ to the state $z^1(n+1)$. The following holds true in this case:

$$z^1(n+1) = A^n z^1(1) \oplus \sum_{j=1}^{n} A^{n-j} u^1(j)$$

In this case, $$z^1(n+1)=S(L1, u^1(1), \ldots, u^1(n))$$

where $u^1(i)=Cod1(y(i))$ is designated as the signature of the data sequence $y(1), \ldots, y(n)$ of the first linear automaton circuit L1.

The initial state $z^1(1)$ shall hereinafter be equal to the K1-dimensional zero vector 0. For carrying out the method according to the invention it is not necessary for the initial state $z^1(1)$ to be formed as the zero vector. This assumption is made here in order to simplify the subsequent calculations.

If there is an error e(i) in the i-th data word of the data stream, then at the i-th instant, instead of the correct data word y(i), the faulty data word $$y'(i)=y(i) \oplus e(i)$$

is input into the first coder C1. In this case, the error e(i) is a k-dimensional binary vector. Those components of this binary vector which assume the value one designate the positions of the faulty bits in the i-th data word.

If only the i-th data word is faulty and all the other data words are correct, then the following holds true where $z^1(1)=0$ when the data stream that is only faulty in the i-th data word is input into the first coder C1 where $$u^{1'}(i) = Cod1(y'(i))$$
$$= Cod1(y(i) \oplus e(i))$$
$$= Cod1(u(i)) \oplus f_1(e(i))$$
$$= u^1(i) \oplus f_1(e(i))$$

$$z^{1'}(n+1) = \sum_{j=1}^{n} A^{n-i} u^1(j) \oplus A^{n-1} \cdot f_1(e(i)) \quad (II)$$

$$= z^1(n+1) \oplus A^{n-i} f_1(e(i)) \quad (III)$$

and hence $$A^{n-i} \cdot f_1(e(i)) = z^{1'}(n+1) \oplus z^1(n+1) \quad (IV)$$
$$= S(L1, u^1(1), \ldots, u^{1'}(i), \ldots, u^1(n)) \oplus$$
$$S(L1, u^1(1), \ldots, u^1(i), \ldots, u1(n))$$
$$= \Delta S1$$

For the case where $f(e(i))=Cod1(e(i))$, the following is obtained $$A^{n-i} Cod1(e(i))=\Delta S1 \quad (V)$$

For the case where $Cod1(y(i))=y(i), i=1, \ldots, n$ holds true, the following results $$A^{n-i} \cdot e(i)=\Delta S1 \quad (VI)$$

The function of the second coder C2 is described precisely below.

For $i=1, \ldots, n$, the second coder C2 codes the data word y(i) having the data word length of k bits into the coded data word $u^2(i)$, $u^2(i)=Cod2(y(i))$. The coded data word $u^2(i)$ has a word width of K2 bits. In this case, Cod2 designates the coding function of the second coder C2.

If y'(i) is the component-by-component XOR sum of two k bit wide words y(i) and e(i).

$$y'(i)=y(i) \oplus e(i),$$

then the following is intended to hold true for the coding function Cod2

$$u^{2'}(i) = Cod2(y'(i))$$
$$= Cod2(y(i) \oplus e(i))$$
$$= Cod2(y(i)) \oplus f_2(e(i))$$
$$= u^2(i) \oplus f_2(e(i))$$

so that there is a function $f_2^{-1}$ where $f_2^{-1}(f_2(e))=e$ for all binary data words e having the word width k which may be taken into consideration as errors.

The function of the second linear automaton circuit L2 is described in detail below.

The second linear automaton circuit L2 is formed over the field GF(2) and has a K2-dimensional state vector $z^2(t)$. $K2 \geq k$ holds true in this case.

The second linear automaton circuit L2 is described by the equation $$z^2(t+1) = B \cdot z^2(t) u^2(t) \qquad \text{(VII)}$$

where $z^2(t)$ and $z^2(t+1)$ are K2-dimensional binary state vectors at the discrete instants t and t+1. $u^2(t)$ is the coded data word that is input at the instant t. B where $B \neq A$ is a uniquely reversible binary (K2×K2) matrix. The addition and multiplication in (VII) are effected modulo 2.

After the data stream $T_n$ comprising the n data words $y(1), \ldots, y(n)$ has been input into the second coder C2 and after the coded data words $u^2(1), \ldots, u^2(n)$ have been input into the second linear automaton circuit L2, the second linear automaton circuit L2 undergoes transition from its initial state $z^2(1)$ to the state $z^2(n+1)$ $$z^2(n+1) = B^n z^2(1) \oplus \sum_{j=1}^{n} B^{n-j} u^2(j) \qquad \text{(VIII)}$$

In this case, $$z^2(n+1) = S(L2, u^2(1), \ldots, u^2(n))$$

where $u^2(i) = \text{Cod2}(y(i))$ is designated as the signature of the data stream $y(1), \ldots, y(n)$ in the second linear automaton circuit L2.

The K1-dimensional zero vector 0 subsequently forms the initial state $z^2(1)$.

If there is then an error $e(i)$ in the i-th data word of the data stream, then at the i-th instant, instead of the correct data word $y(i)$, the faulty data word $y'(i) = y(i) \oplus e(i)$ is input into the second coder Cod2.

If only the i-th data word is faulty and all the other data words are correct, then there holds true, where $z^2(1)=0$, where $$\begin{aligned} u^{2\prime}(i) &= \text{Cod2}(y(i) \oplus e(i)) \qquad \text{(analogous to (III))} \\ &= u^2(i) \oplus f_2(e(i)) \end{aligned}$$

$$\begin{aligned} z^{2\prime}(n+1) &= \sum_{i=1}^{n} B^{n-i} u^2(j) + B^{n-i} f_2(e(i)) \qquad \text{(IX)} \\ &= z^2(n+1) \oplus B^{n-i} f_2(e(i)) \end{aligned}$$

and where $$\begin{aligned} z^{2\prime}(n+1) &\oplus z^2(n+1) \\ &= S(L2, u^2(1), \ldots, u^{2\prime}(i), \ldots, \\ &\quad u^2(n)) \oplus S(L2, u^2(1), \ldots, \\ &\quad u^2(i), \ldots, u^2(n)) \\ &= \Delta S2 \end{aligned}$$

the following equation:

$$\Delta S2 = B^{n-i} f_2(e(i)) \qquad \text{(X)}$$

For the case where $f_2(e(i)) = \text{Cod2}(e(i))$ the following holds true instead of (X)

$$\Delta S2 = B^{n-i} \text{Cod2}(e(i)) \qquad \text{(XI)}$$

For the case where $\text{Cod2}(e(i)) = e(i)$ holds true, the following results $$\Delta S2 = B^{n-i} \cdot e(i) \qquad \text{(XII)}$$

If the results of the processing of the data stream in the linear automaton circuits L1 and L2 are combined, then the following are obtained from equations (IV) and (X)

$$e(i) = f_1^{-1}(A^{i-n} \Delta S1) \qquad \text{(XIV)}$$

$$e(i) = f_2^{-1}(B^{i-n} \Delta S2) \qquad \text{(XV)}$$

which result in the following equation:

$$f_1^{-1}(a^{i-n} \Delta S2) = f_2^{-1}(B^{i-n} \Delta S2) \qquad \text{(XVI)}$$

By means of the equation (X-VI) it is possible to calculate i, $i \in \{1, \ldots, n\}$, that is to say the position i of the faulty data word y'(i).

The value for i from equation (XVI) can be calculated e.g., iteratively by calculating for $i=1, 2, \ldots$ the value of the left-hand and right-hand sides of equation (XVI) until both sides match.

If the value for i has been determined in this way, then it is possible, by means of equation (XIV), also to directly determine the value for e(i), that is to say the position of the faulty data word in the data stream.

FIG. 6 illustrates a flowchart 6 for illustrating the method according to the invention for detecting an error e(i) in a data word y'(i).

The first flowchart 6 provides a total of seven method processes 61-67, the method processes 62 and 65 being formed as decision fields and the remaining method processes being formed as execution fields.

The first method process 61 involves generating the signature differences $\Delta S1$ and $\Delta S2$ and also a data stream $T_n$, as is illustrated e.g., in FIGS. 1 and 2. Said data stream $T_n$ may be formed from a sequence of measurement data of a DUT.

As described thoroughly with reference to FIG. 5, said data stream $T_n$ is fed via the first coder C1 to the first linear automaton circuit L1 and, at the same time as this, via the second coder C1 to the second linear automaton circuit L2. From the signatures generated by the linear automaton circuits L1 and L2 and from the good signatures provided, the exclusive-OR gates $\text{XOR}_{L1}$ and $\text{XOR}_{L2}$ determine the signature differences $\Delta S1$ and $\Delta S2$ from the difference between the good and poor signatures in accordance with equation (1) and equation (2) and provide the signature differences $\Delta S1$ and $\Delta S2$ at the outputs 52 and 53.

In the second method process 62, the signature difference $\Delta S1$ present at the first output 52 is compared with zero. If the signature difference $\Delta S1$ is equal to zero, this means that no error could be detected in the data stream $T_n$. In this case, the method continues with the checking of the next data stream $T_n$. If the signature difference $\Delta S1$ is not equal to zero, this means that one or arbitrarily many faulty data words $y(1), \ldots, y(n)$ are faulty. In this case, the method continues with the method step 63.

In the method process 63, the states $z(t=n+1)$ of the linear automaton circuits L1 and L2 are in each case reset to the values of the respective other signature differences $\Delta S1$ and $\Delta S2$.

The method process 64 involves calculating back for $y(t)=0$, to be precise the linear automaton circuits L1 and L2 are accumulated in (n-i) steps for $y(t)=0$ and the states according to equation (26) are checked for identity. This process of calculating back is known to the person skilled in the art and need not be explained any further here.

The method process 65 involves checking whether a solution exists. If this is not the case, then more than one data word $y(1), \ldots, y(n)$ of the data stream $T_n$ is faulty.

If a solution does exist, then the data word y'(i) and the error e(i) are calculated in the method step 66.

In this case, firstly the data word y'(i) is determined from the number of traversed cycles of the linear automaton circuit L1 and L2.

The error e(i) is then calculated from equation (30):

$$e(i)=z(t) \text{ for } t=i, \ 1 \leq i \leq N \tag{30}$$

z(t=i) is the state of the two linear automaton circuits L1 and L2 at the instant t=i.

In a further exemplary embodiment, it is also possible to check two serial, that is to say successive, data streams $T_n$.

In this case, the left-hand branch of the measurement data word line 51 is traversed twice in succession and the right-hand branch of the measurement data word line 51 is not traversed at all, in the second pass the first coder C1 being replaced by the second coder C2 if the first coder C1 differs from the second coder C2 and the first linear automaton circuit L1 with the state matrix A being replaced by the second linear automaton circuit L2 with the state matrix B, B≠A, which may be effected technically e.g., in a simple manner using multiplexers.

If the method is realized on a computer system, then that program part which realizes the first linear automaton circuit L1 is quite simply to be replaced in the second pass by that program part which realizes the second linear automaton circuit L2. Likewise, if the coders C1 and C2 differ from one another, the function Cod1 of the first coder C1 in the first pass is to be replaced by the function Cod2 of the second coder C2 in the second pass.

In this case, S1 is the signature calculated in the first pass and S2 is the signature calculated in the second pass. The method essentially matches the method described in the previous exemplary embodiment.

The implementation of the method is readily possible for a person skilled in the art on the basis of the information given in this patent specification.

The following document has been cited in the context of this patent specification:

[1] Rohling H., Einführung in die Informations- und Codierungstheorie, Teubner Verlag, 1995 [Introduction to information and coding theory]

In order to unambiguously identify and diagnose an error e(i) at the position i of the data stream $T_n$, it is, surprisingly, not necessary for the feedback polynomial to be primitive or irreducible. It actually suffices here for the matrix B to be the inverse of the matrix A.

Thus, the value of the position of the error i, which must naturally occur in the data stream from 1 to n, is determined from the equation $$f_1^{-1}(A^{i-n}\Delta S_1)=f_2^{-1}(B^{i-n}\Delta S_2)$$

and where then=$A^{-1}$ as $$f_1^{-1}(A^{i-n}\Delta S_1)=f_2^{-1}(A^{n-i}\Delta S_2)$$

Moreover, for e(i), the faulty bit positions in the faulty i-th data word, the following results $$e(i)=f_1^{-1}(A^{i-n}\Delta S_1).$$

If the matrix A has an inverse matrix $A^{-1}$, then $A^k e(i) \neq 0$ holds true for e(i)≠0 for any k. Thus, and because a linear superposition principle holds true for linear shift registers, an individual error e(i) which has corrupted different bits at the position i can never be masked. By virtue of the fact that the signature is furthermore also provided in two different multi-input signature registers with mutually inverse matrices A and B=$A^{-1}$, it is even possible to determine the position i and the value e(i) exactly.

A masking of errors in a signature which is identical to the good signature can only occur with a vanishingly small probability if a plurality of errors occur at a plurality of bit positions which cancel out randomly in their signature. In the case of a single faulty position this is not possible, as explained.

The probability, when a plurality of errors are present, of the equation $$f_1^{-1}(\Delta S_1)=f_2^{-1}(A^{n-i}\Delta S_2)$$

having a solution for i where 1≤i≤n is negligibly small and if it happens that no solution can be found for i, this means that there is no individual error e(i) present which has only faulty bits at the position i in the data stream. The property whereby the feedback polynomial is intended to be primitive is an advantageous configuration for which the error masking probability that is inherently already practically negligibly small is especially small for errors which relate to a plurality of positions in the data stream $T_n$.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An evaluation circuit for detecting and/or locating faulty data words in a data stream $T_n$ comprising:
   a first linear automaton circuit and a second linear automaton circuit connected in parallel, each having a set of states, wherein the first linear automaton circuit and the second linear automaton circuit each have inputs that are commonly connected for receiving a data stream $T_n$ comprising n successive data words y(1), . . . , y(n) each having a width of k bits, k>1,
   wherein the first linear automaton circuit can be described by the following equation $$z(t+1)=Az(t) \oplus y(t)$$

wherein the second linear automaton circuit can be described by the following equation $$z(t+1)=Bz(t) \oplus y(t)$$

where z represents state vectors and A and B represent the state matrices of the linear automaton circuits, where the state matrices A and B can be inverted, and where a dimension L of the state vectors z is ≥k, wherein A≠B,
   the first linear automaton circuit and the second linear automaton circuit are designed such that a first signature and a second signature, respectively, is calculated of each data word of the n successive data words y(1), . . . , y(n),
   L first logic combination gates arranged downstream of the first linear automaton circuit and also L second logic combination gates arranged downstream of the second linear automaton circuit,
   the logic combination gates are designed such that the signature respectively calculated by the linear automaton circuit can be compared with a predeterminable good signature and a comparison value can be output.

2. The evaluation circuit as claimed in claim 1, comprising wherein the logic combination gates are present as exclusive-OR gates whose first inputs are respectively connected to the outputs of the associated linear automaton circuit (L1, L2) and to whose second inputs good signatures can be applied.

3. The evaluation circuit as claimed in claim 1, comprising wherein arranged upstream of the first linear automaton circuit is a first coder, that codes the data word y(i) having the data word length of k bits into a coded data word $u^1(i)$, $u^1(i)=\text{Cod1}$ having the word width of K1 bits, for i=1, ..., n, and where Cod1 represents the coding function of the first coder.

4. The evaluation circuit as claimed in claim 3, comprising wherein the following holds true for the coding function of the first coder:

$$Cod2(y'(i)) = u^2(i) \oplus f_2(e(i)),$$

or $$Cod2(y'(i)) = Cod2(y(i) \oplus e(i)) = Cod2(y(i)) \oplus f_2(e(i))$$

where a function $f_1$ by $f_1(0)=0$ exists for $y'(i)=y(i)\oplus e(i)$, and where a function $f_1^{-1}$ where $$f_1^{-1}(f_1(e))=e$$

exists for all binary data words e having the word width k which may occur as errors of a data word, where e denotes a faulty data word of the data stream $T_n$.

5. The evaluation circuit as claimed in claim 3, comprising wherein arranged upstream of the second linear automaton circuit is a second coder, which codes the data word y(i) having the data word length of k bits into an encoded data word $u^2(i)$, $u^2(i)=\text{Cod2}(y(i))$ having the word width of K2 bits, for i=1, ..., n, and where Cod2 represents the coding function of the second coder.

6. The evaluation circuit as claimed in claim 5, comprising wherein the following holds true for the coding function of the second coder:

$$Cod2(y'(i))=u^2(i)\oplus f_2(e(i)),$$

or $$Cod2(y'(i))=Cod2(y(i)\oplus e(i))=Cod2(y(i))\oplus f_2(e(i))$$

where a function $f_2^{-1}$ where $$f_2^{-1}(f_2(e))=e$$

exists for all binary data words e having the word width k which may occur as errors of a data word, where e denotes a faulty data word of the data stream $T_n$.

7. The evaluation circuit as claimed in claim 5, comprising wherein that the word width K1 of the data words $u^1(i)$ coded by the first coder is equal to the word width K2 of the data words $u^2(i)$ coded by the second coder.

8. The evaluation circuit as claimed in claim 5, comprising wherein the first coder matches the second coder with regard to its construction and its function.

9. The evaluation circuit as claimed in claim 5, comprising wherein the word width K1 of the data words $u^1(i)$ coded by the first coder and the word width K2 of the data words $u^2(i)$ coded by the second coder are in each case equal to the word width k of the data words y(1), ..., y(n) of the data stream $T_n$.

10. The evaluation circuit as claimed in claim 5, comprising wherein the coding functions Cod1 and Cod2 of the first coder and of the second coder are designed as follows:

$$Cod1(y_1(i),y_2(i),\ldots,y_k(i))=P1(y_1(i),y_2(i),\ldots,y_k(i),0,\ldots,0)$$

$$Cod2(y_1(i),y_2(i),\ldots,y_k(i))=P2(y_1(i),y_2(i),\ldots,y_k(i),0,\ldots,0)$$

for i, 1, ..., n
where the number of zeros situated at the end of $P1(y_1(i), y_2(i),\ldots,y_k(i),0,\ldots,0)$ is equal to (K1–k), where the number at the end of $P2(y_1(i), y_2(i), \ldots, y_k(i), 0, \ldots, 0)$ is equal to (K2–k), and where P1 represents an arbitrary permutation of the K1 components of $(y_1(i), y_2(i), \ldots, y_k(i), 0, \ldots, 0)$ and P2 represents an arbitrary permutation of the K2 components of $(y_1(i), y_2(i), y_k(i), 0, \ldots, 0)$.

11. The evaluation circuit as claimed in claim 3, comprising wherein the coding functions Cod1 and Cod2 of the first coder and of the second coder are designed as follows:

$$Cod1(y_1(i),y_2(i),\ldots,y_k(i))=P1(y_i(i),y_2(i),\ldots,y_k(i),b_1^1,\ldots,b_{K1\,k}^1)$$

$$Cod2(y_1(i),y_2(i),\ldots,y_k(i))=P2(y_1(i),y_2(i),\ldots,y_k(i),b_1^2,\ldots,b_{K2\,k}^2)$$

where $b_1^1,\ldots,b_{K1-k}^1, b_1^2,\ldots,b_{K2-k}^2 \in \{0.1\}$, and where P1 and P2 represent arbitrary permutations.

12. The evaluation circuit as claimed in claim 3, comprising wherein the coding function Cod1 of the first coder is designed such that it realizes a linear block code, $f_1=\text{Cod1}$.

13. The evaluation circuit as claimed in claim 5, comprising wherein the coding function Cod2 of the second coder is designed such that it realizes a linear block code, $f_2=\text{Cod2}$.

14. The evaluation circuit as claimed in claim 1, comprising wherein the state matrix A of the first linear automaton circuit and the state matrix B of the second linear automaton circuit are related to one another as follows:

$$B=A^n$$

where $n \neq 1$.

15. The evaluation circuit as claimed in claim 1, comprising wherein the state matrix B of the second linear automaton circuit is equal to the inverted state matrix $A^{-1}$ of the first linear automaton circuit.

16. The evaluation circuit as claimed in claim 1, comprising wherein the first linear automaton circuit is designed as a linear feedback shift register and the second linear automaton circuit is designed as an inverse linear feedback shift register, both linear automaton circuits having a parallel input.

17. The evaluation circuit as claimed in claim 1, comprising wherein the first linear automaton circuit is designed as a linear feedback, K1-dimensional multi-input shift register or the second linear automaton circuit is designed as a linear feedback, multi-input shift register.

18. The evaluation circuit as claimed in claim 17, comprising wherein the multi-input shift register have a primitive feedback polynomial of maximum length.

19. A method for detecting and/or locating faulty data words in a data stream $T_n$, the method having the following method steps of:

inputting data words y(1), ..., y(i–1), y'(i), y(i+1), ..., y(n) of a data stream $T_n$ into a first coder, each data word having a width of k bits, k>1, encoding the data words y(1), ..., y(n) into coded data words $u^1(1)$, ..., $u^1(n)$ having a word width K1 where K1≧k by means of the coding function Cod1 of the first coder, inputting the coded data words $u^1(1), \ldots, u^1(i-1), u^{1'}(i)$ or $u^1(i), u^1(i), \ldots, u^1(n)$ into the inputs of a first linear automaton circuit, which is described by the automaton equation;

$$z^1(t+1)=A \cdot z^1(t)+u^1(t)$$

where t is an instant in time, $z^1$ represents a K1-dimensional state vector and A represents a K1×K1 state matrix, and where the state matrix A can be inverted, processing the coded data words $u^1(1), \ldots, u^1(i-1), u^{1'}(i)$ or $u^1(i), u^1(i), \ldots, u^1(n)$ by means of the first linear automaton circuit, the first linear automaton circuit,
undergoing transition to the state $z^1(n+1)= S_1(L1, y(1), \ldots, y(i-1), y(i), y(i+1), \ldots, y(n))$ if no error can be detected in the case of the coded data words $u^1(1), \ldots, u^1(i-1), u^1(i), u^1(i+1), \ldots, u^1(n)$,
undergoing transition to the state $z^{1'}(n+1)= S_1(L1, y(1), \ldots, y(i-1), y'(i), y(i+1), \ldots, y(n))$ if an error is present at least in the case of the i-th position of the coded data words $u^1(1), \ldots, u^1(i-1), u^{1'}(i), \ldots, u^1(n)$,
the signature of an error-free data stream $T_n$ being designated by $S(L1, y(1), \ldots, y(i-1), y(i), y(i+1), \ldots, y(n))$ and the signature of a faulty data stream $T_n$ being designated by $S(L1, y(1), \ldots, y(i-1), y'(i), y(i+1), \ldots, y(n))$,
checking the determined signature of the data stream $T_n$ and continuing with method step a) for further data streams $T_n$ if the determined signature of the data stream $T_n$ is the signature of an error-free data stream $T_n$,
inputting the data words $y(1), \ldots, y(i-1), y'(i), \ldots, y(n)$ of the data stream $T_n$ in a second coder,
coding the data words $y(1), \ldots, y(i-1), y'(i), y(i+1), \ldots, y(n)$ to coded data words $u^2(1), \ldots, u^2(i-1), u^{2'}(i)$ or $u^2(i), u^2(i), \ldots, u^2(n)$ having the word width K2 where $K2 \geq k$ by means of the coding function Cod2 of the second coder,
inputting the coded data words $u^2(1), \ldots, u^2(i-1), u^{2'}(i)$ or $u^2(i), u^2(i), \ldots, u^2(n)$ into the inputs of a second linear automaton circuit, which is described by the automaton equation $$z^2(t+1)=B \cdot z^2(t) \oplus u^2(t)$$

where $z^2$ represents a K2-dimensional state vector and B represents a K2×K2 state matrix where $B \neq A$, and where the state matrix B can be inverted,
processing the coded data words $u^2(1), \ldots, u^2(i-1), u^{2'}(i)$ or $u^2(i), u^2(i), \ldots, u^2(n)$ by means of the second linear automaton circuit, the second linear automaton circuit,
undergoing transition to the state $z^2(n+1)=S_2(L2, y(1), \ldots, y(i-1), y(i), y(i+1), \ldots, y(n))$ if no error can be detected in the case of the data words $u^2(1), \ldots, u^2(i-1), u^2(i), u^2(i), \ldots, u^2(n)$,
undergoing transition to the state $z^{2'}(n+1)=S_2(L2, y(1), \ldots, y(i-1), y(i), y'(i), y(i+1), \ldots, y(n))$ if an error is present at least in the case of the i-th position of the coded data words $u^2(1), \ldots, u^2(i-1), u^{2'}(i), u^2(i), \ldots, u^2(n)$,
the signature of an error-free data stream $T_n$ being designated by $S(L2, y(1), \ldots, y(i-1), y(i), y(i+1), \ldots, y(n))$ and the signature of a faulty data stream $T_n$ being designated by $S(L2, y(1), \ldots, y(i-1), y'(i), \ldots, y(n))$,
determining the signature differences ΔS1 and ΔS2 by means of exclusive-OR logic combinations of the signatures S1 and S2 ascertained good signatures, in each case according to the following specifications:

$$\Delta S1 = S(L1, y(1), \ldots, y(i-1), y(i), y(i+1), \ldots, y(n))$$

$$\oplus S(L2, y(1), \ldots, y(i-1), y'(i), y(i+1), \ldots, y(n))$$

$$\Delta S2 = S(L2, y(1), \ldots, y(i-1), y(i), y(i+1), \ldots, y(n))$$

$$\oplus S(L2, y(1), \ldots, y(i-1), y'(i), y(i+1), \ldots, y(n))$$

determining a unique solution for the position i of the faulty bit in the faulty data word by solving the equation $$f_1^{-1}(A^{i-n} \Delta S1) = f_2^{-1}(B^{i-n} \Delta S2)$$

and if no unique solution results for $1 \leq i \leq n$, outputting a notification by means of an output medium that two or more errors are present in the data stream $T_n$ under consideration,
determining a unique solution for the counter e(i) of the faulty data word y'(i) in the data stream $T_n$ by solving the equation $$e(i) = f_1^{-1}(A^{i-n} \Delta S1)$$

outputting the position i of the faulty bit in the faulty data word and also the error e(i) of the faulty data word y'(i) in the data stream $T_n$ by means of an output medium; and
evaluating an integrated circuit in response to the output.

20. The evaluation circuit as claimed in claim 1, comprising wherein the evaluation circuit is monolithically integrated on an integrated circuit, each data word having a data word length of k.

21. A loadboard for receiving at least one needle card for testing integrated circuits or having at least one test socket for testing integrated circuits or for connecting a handler to a tester of integrated circuits, the loadboard having an evaluation circuit as claimed in claim 1.

22. A needle card for testing integrated circuits, in which an evaluation circuit as claimed in claim 1 is integrated.

23. A tester for testing integrated circuits having the following features:
the tester is provided with a plurality of instruments for generating signals or data streams and with a plurality of measuring sensors, in particular for currents and voltages,
the tester has a loadboard which is provided for receiving at least one needle card for testing integrated circuits and/or for connecting a handler to a tester of integrated circuits and/or which is equipped with at least one test socket for testing integrated circuits, and
the tester has an evaluation circuit as claimed in claim 1.

* * * * *

UNITED STATES PATENT AND TRADEMARK OFFICE
CERTIFICATE OF CORRECTION

PATENT NO. : 8,060,800 B2
APPLICATION NO. : 10/577288
DATED : November 15, 2011
INVENTOR(S) : Michael Goessel et al.

It is certified that error appears in the above-identified patent and that said Letters Patent is hereby corrected as shown below:

Column 21, line 3, delete "codes" and insert in place thereof --encodes--.

Column 21, line 4, delete "a coded" and insert in place thereof --an encoded--.

Column 21, line 6, delete "coding" and insert in place thereof --encoding--.

Column 21, line 9, delete "coding" and insert in place thereof --encoding--.

Column 21, line 13, delete "$Cod2(y'(i)) = u^2(i) \oplus f_2(e(i))$" and insert in place thereof --$Cod1(y'(i)) = u^-(i) \oplus f_1(e(i))$--.

Column 21, line 16, delete "$Cod2(y'(i)) = Cod2(y(i) \oplus e(i)) = Cod2(y(i) \oplus f_2(e(i)))$" and insert in place thereof --$Cod1(y'(i)) = Cod1(y(i) \oplus e(i)) = Cod1(y(i) \oplus f_1(e(i)))$--.

Column 21, line 27, delete "codes" and insert in place thereof --encodes--.

Column 21, line 30, delete "coding" and insert in place thereof --encoding--.

Column 21, line 33, delete "coding" and insert in place thereof --encoding--.

Column 21, line 47, delete "coded" and insert in place thereof --encoded--.

Column 21, line 49, delete "coded" and insert in place thereof --encoding--.

Column 21, line 54, delete "coded" and insert in place thereof --encoded--.

Column 21, line 56, delete "coded" and insert in place thereof --encoded--.

Column 21, line 59, delete "coding" and insert in place thereof --encoding--.

Signed and Sealed this
Twentieth Day of March, 2012

David J. Kappos
*Director of the United States Patent and Trademark Office*

CERTIFICATE OF CORRECTION (continued)
U.S. Pat. No. 8,060,800 B2

Column 21, line 64, delete "Cod2($y_1(i),y_2(i), \ldots, y_k(i)$) = P2($y_1(i),y_2(i),0, \ldots, 0$)" and insert in place thereof --Cod2($y_1(i), y_2(i), \ldots, y_k(i)$) = P2($y_1(i),y_2(i), \ldots, y_k(i),0, \ldots, 0$)--.

Column 22, line 5, delete "$y_1(i),y_2(i),y_k(i) 0, \ldots, 0$)." and insert in place thereof --$y_1(i),y_2(i), \ldots, y_k(i), 0, \ldots, 0$)--.

Column 22, line 16, delete "$b_{k1-k}^1, b_1^2, \ldots, b_{k2-k}^2 \in \{0.1\}$," and insert in place thereof --$b_1^1, \ldots, b_{K1-k}^1, b_\cdot^2, \ldots, b_{K2-k}^2 \in \{0.1\},$--.

Column 22, line 19, delete "coding" and insert in place thereof --encoding--.

Column 22, Line 22, delete "coding" and insert in place thereof --encoding--.

Column 22, line 42, delete "K1-dimensional".

Column. 22, line 46, delete "register" and insert in place thereof --registers--.

Column 22, line 48, delete "testing an integrated circuit device by".

Column 22, line 54, delete "coded" and insert in place thereof --encoded--.

Column 22, line 56, delete "the" and insert in place thereof --a--. (Second occurrence.)